United States Patent [19]

Canepa et al.

[11] Patent Number: 5,047,989

[45] Date of Patent: Sep. 10, 1991

[54] CHAPTER MODE SELECTION APPARATUS FOR MOS MEMORY

[75] Inventors: George R. Canepa; Mark Bauer; Phil Kliza, all of Folsom, Calif.

[73] Assignee: Intel Corporation, Santa Clara, Calif.

[21] Appl. No.: 321,909

[22] Filed: Mar. 10, 1989

[51] Int. Cl.$^5$ .......................... G11C 8/00; G06F 12/06
[52] U.S. Cl. ......................... 365/238.5; 365/230.03; 365/230.08; 364/200; 364/900
[58] Field of Search ............ 365/189.02, 189.03, 365/189.05, 189.07, 230.03, 230.02, 230.08, 238.05, 189.01, 195

[56] References Cited

U.S. PATENT DOCUMENTS

| | | | |
|---|---|---|---|
| 4,368,515 | 1/1983 | Nielsen | 364/200 |
| 4,685,084 | 8/1987 | Canepa | 365/230.08 |
| 4,719,598 | 1/1988 | Stockton | 365/189.03 |
| 4,864,542 | 10/1989 | Oshima et al. | 235/382.5 |

Primary Examiner—James W. Moffitt
Assistant Examiner—Jack A. Lane
Attorney, Agent, or Firm—Blakely, Sokoloff, Taylor & Zafman

[57] ABSTRACT

An EPROM includes an on chip circuitry for selecting an alternative chapter mode addressing scheme. By utilizing the chapter addressing mode, a plurality of devices can be coupled in parallel, wherein each device is treated as a chapter of the total memory capacity. Hard latches are used to store a designated code and soft latches are used to latch in chapter addresses from data lines. A chapter is evaluated if values stored in the hard latch match the values inputted to the soft latch.

36 Claims, 8 Drawing Sheets

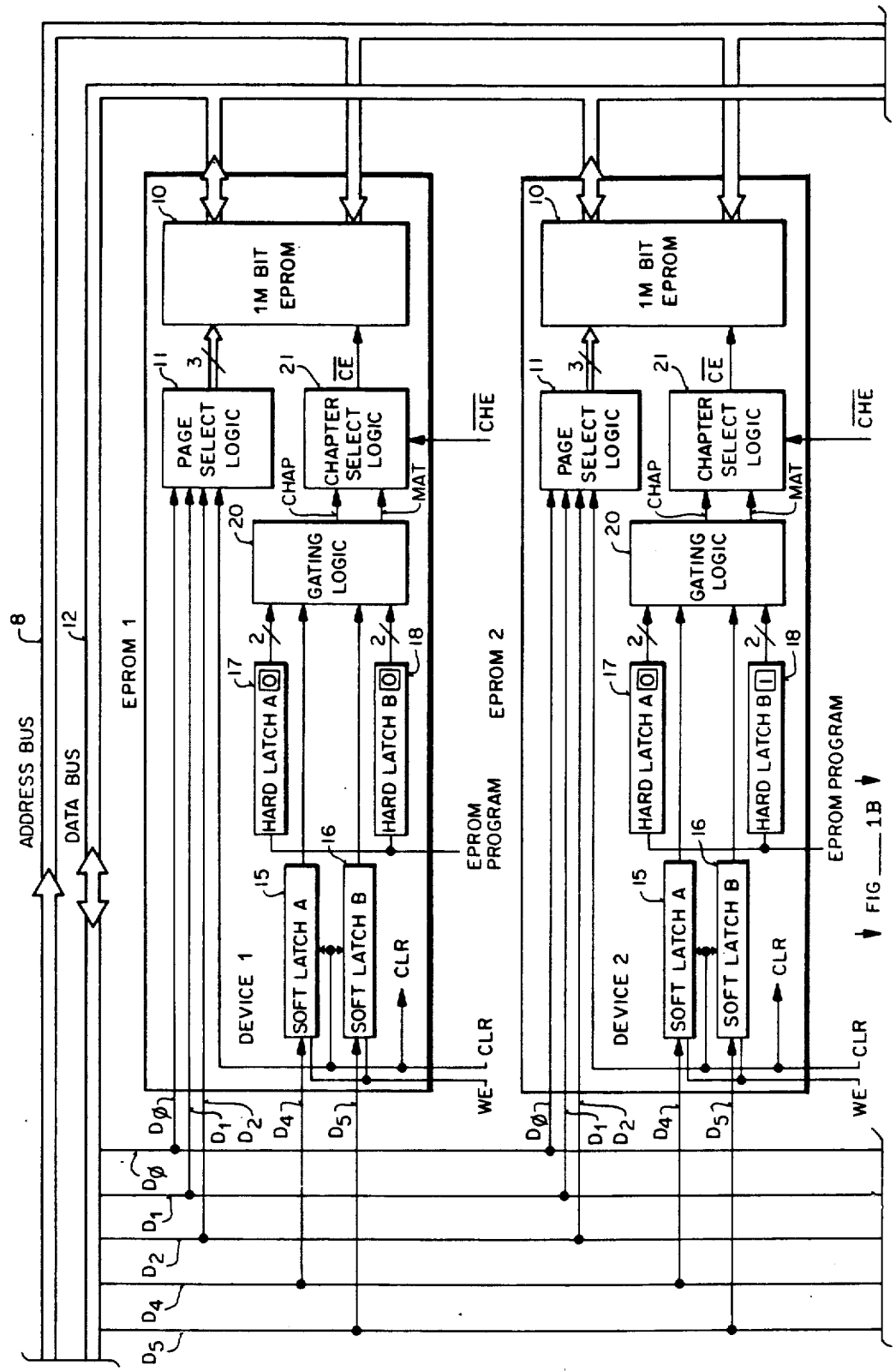

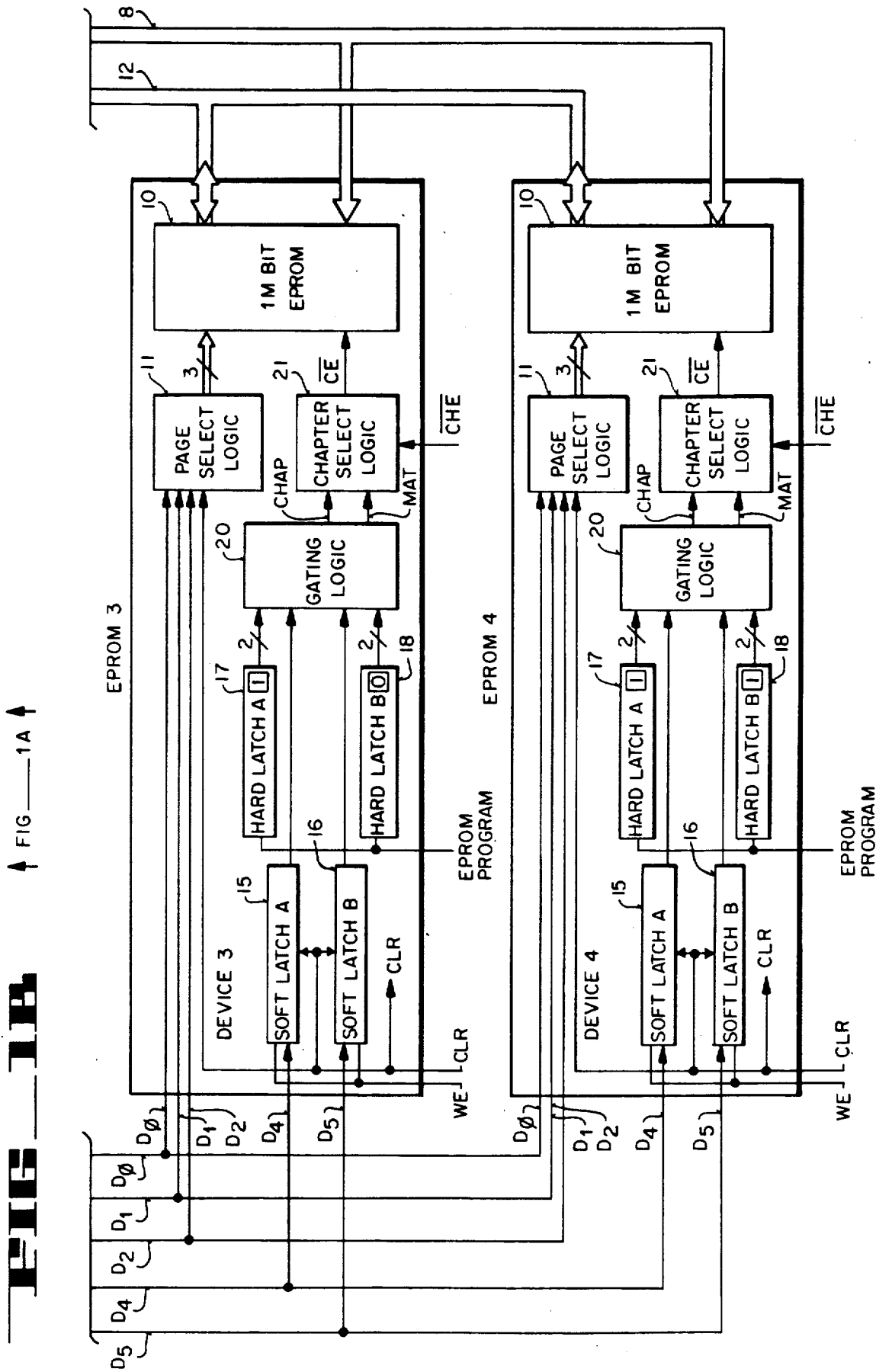

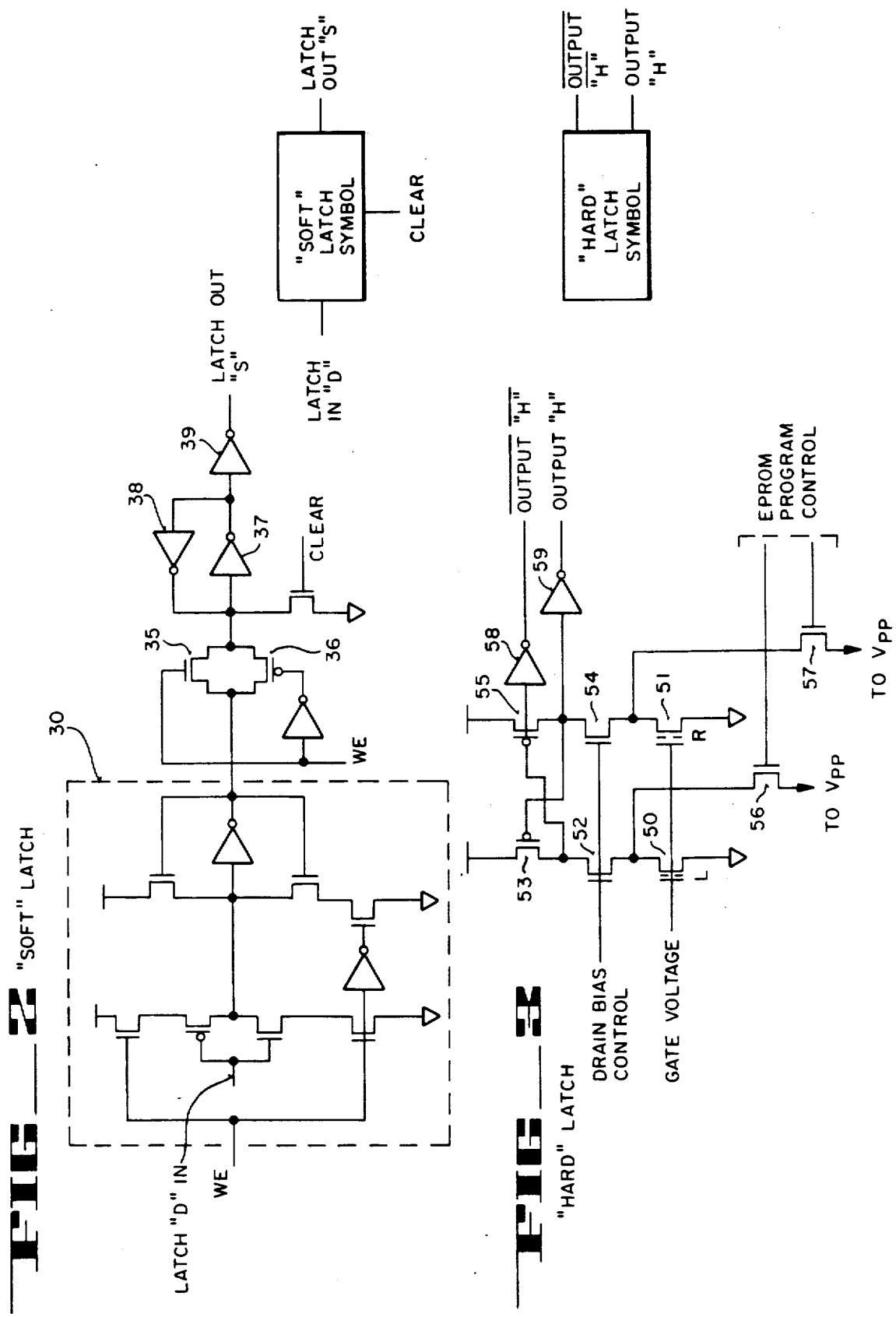

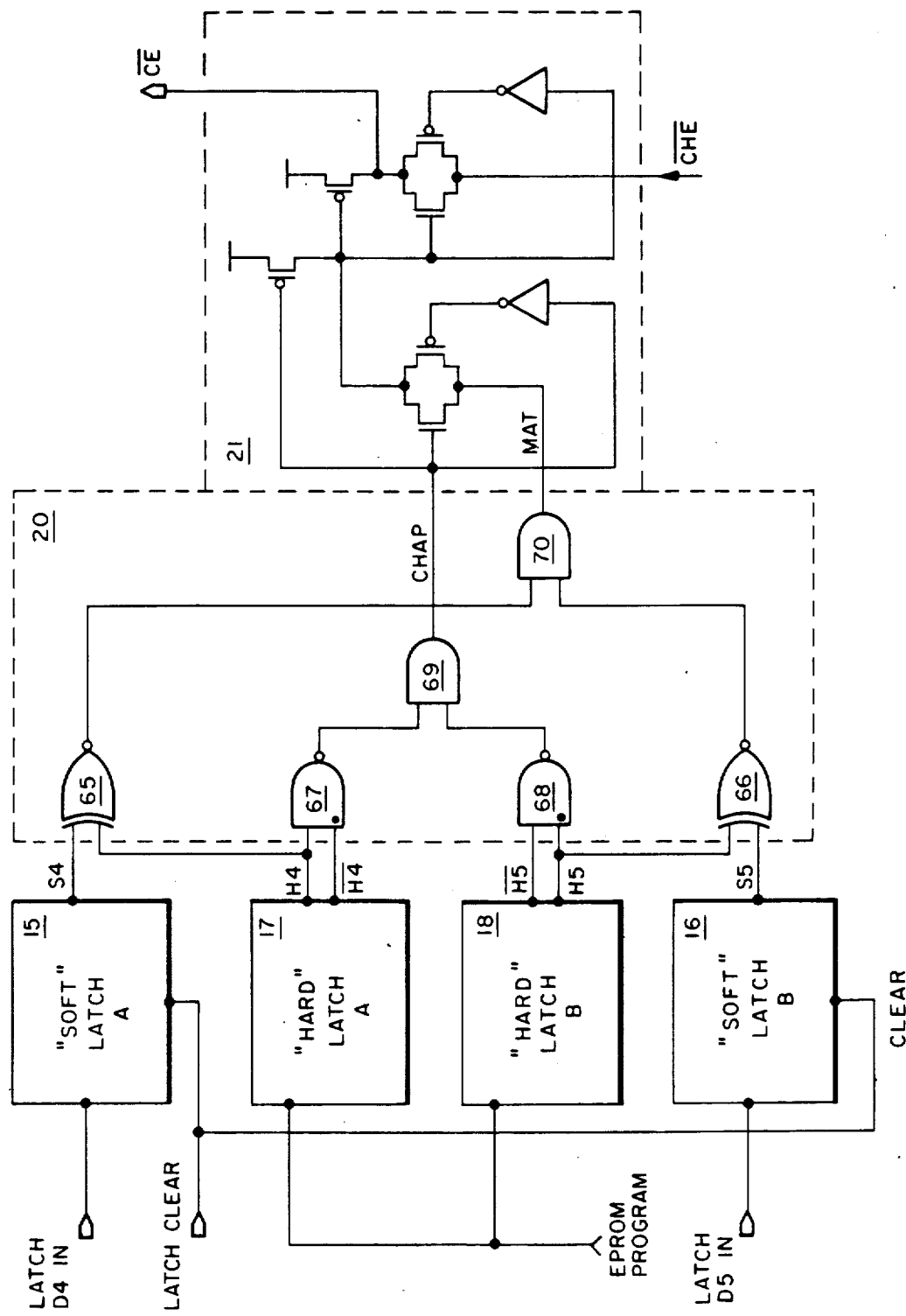

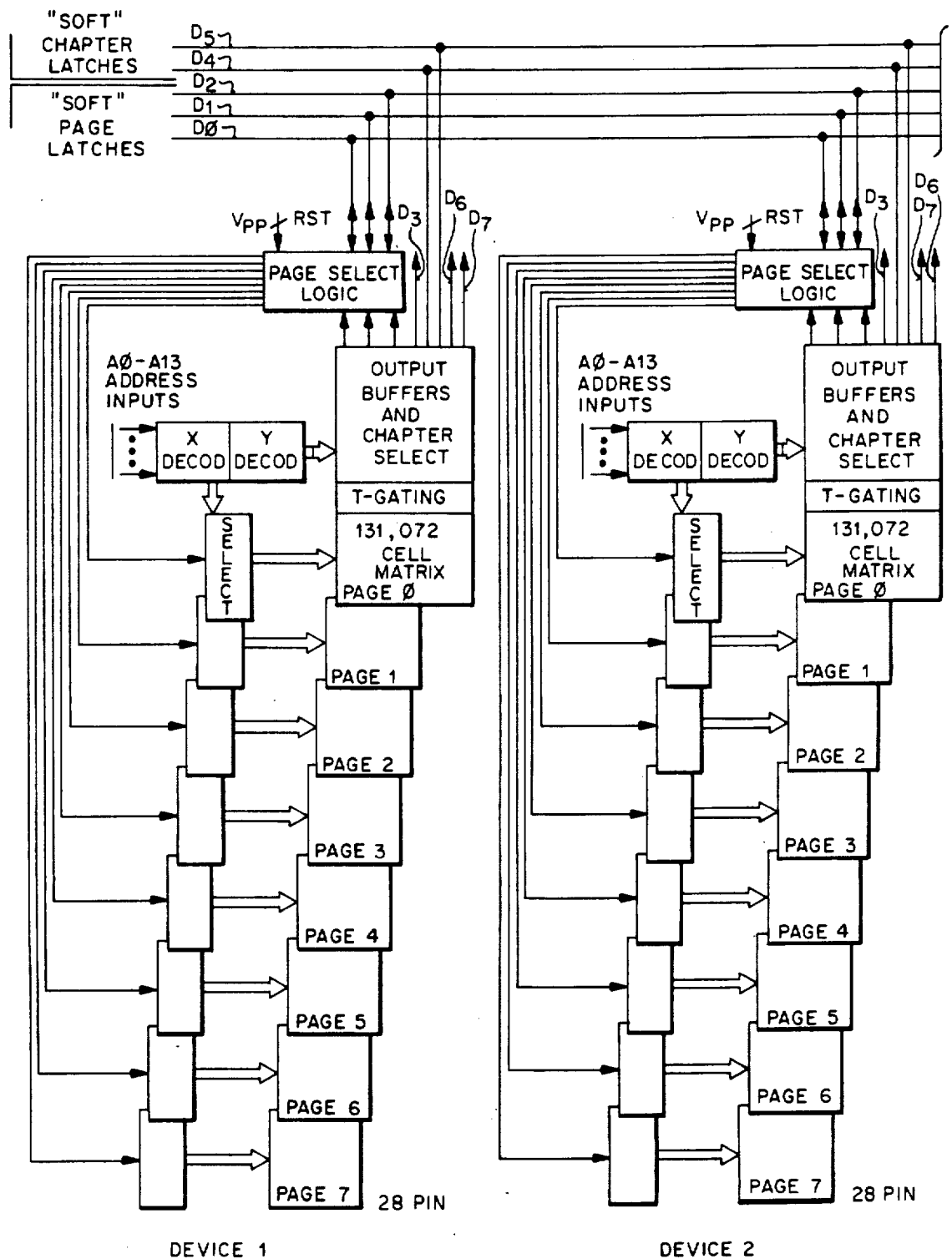
FIG._5A

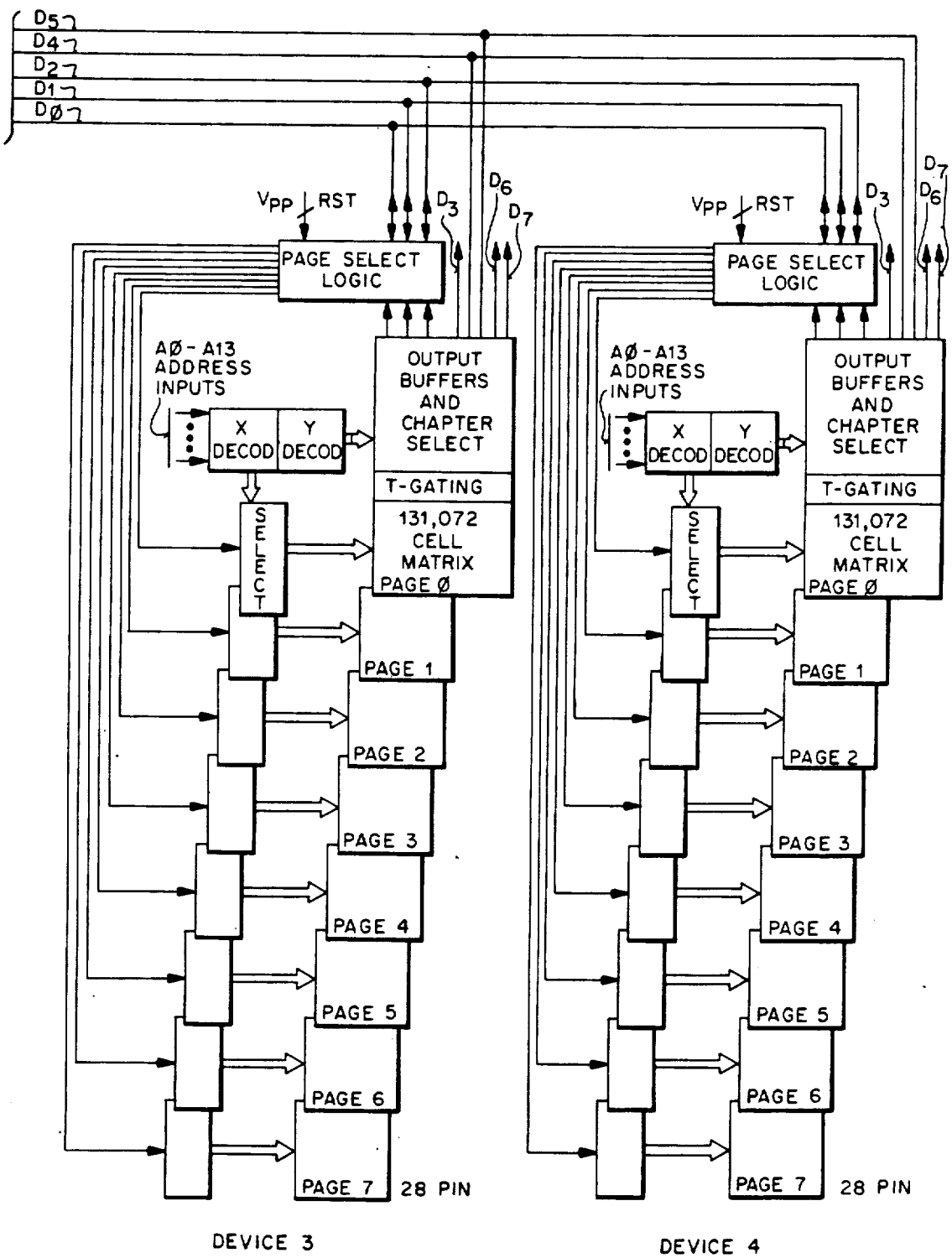
FIG_5B

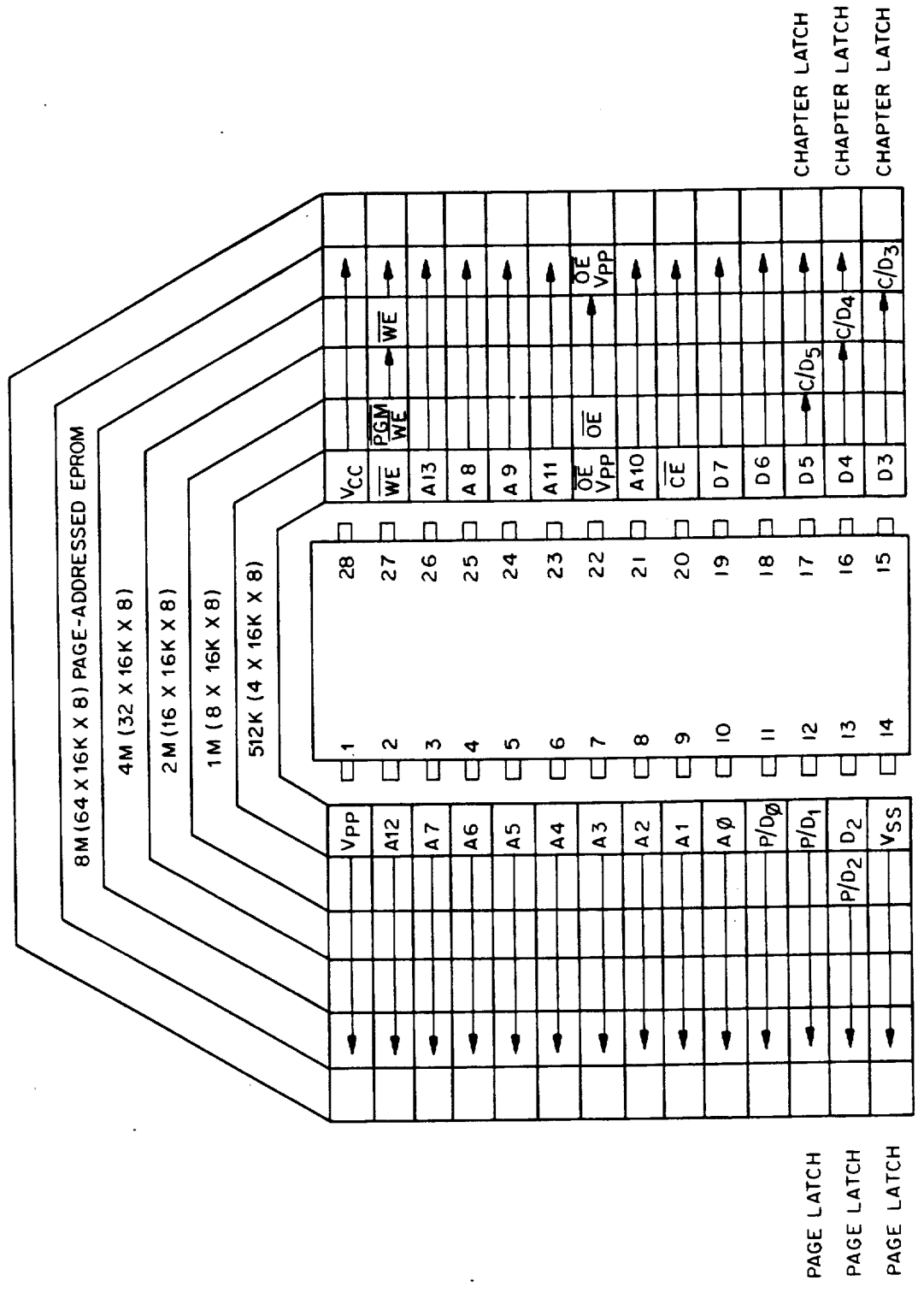
FIG_6A

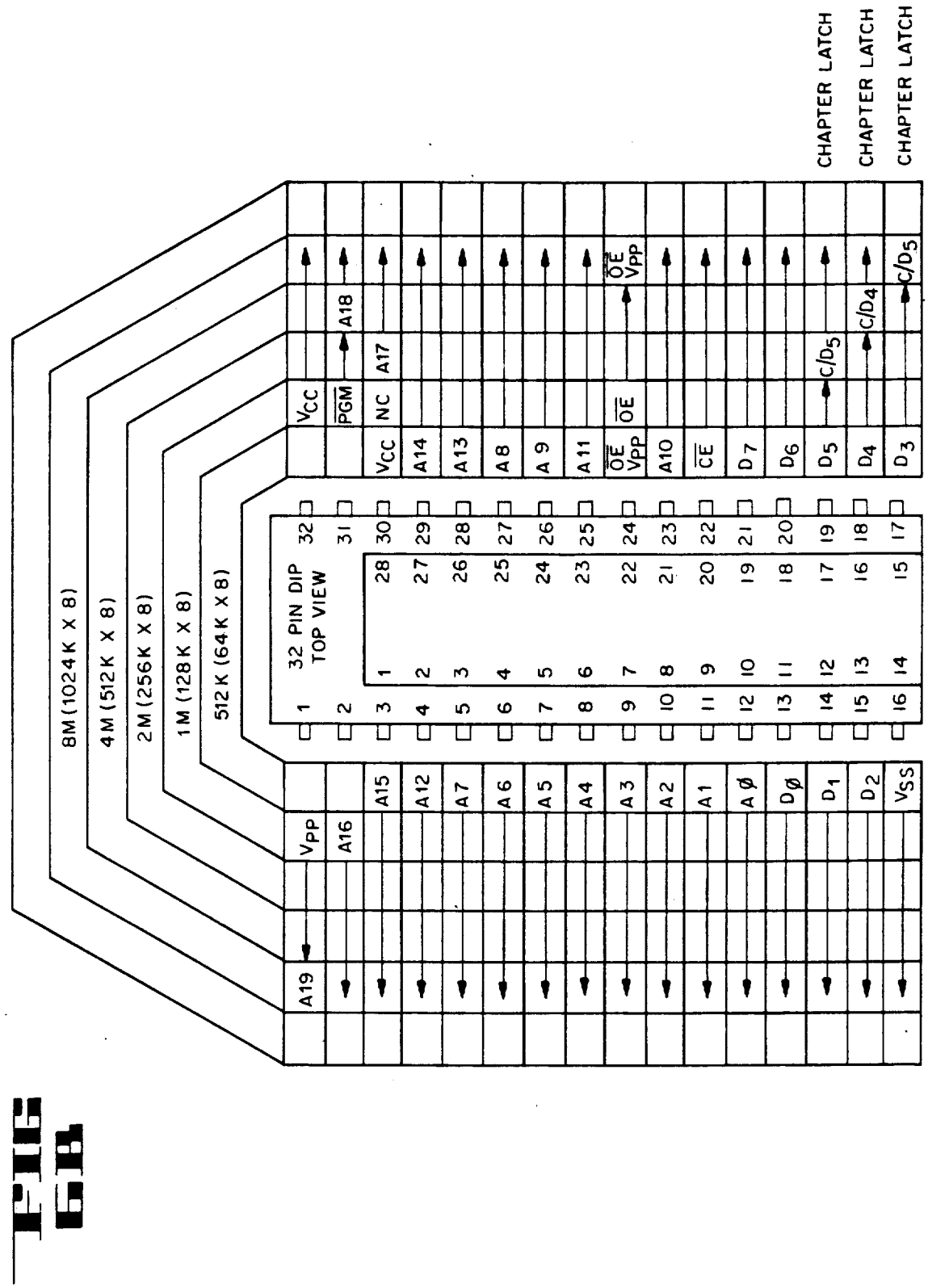

CHAPTER MODE SELECTION APPARATUS FOR MOS MEMORY

BACKGROUND OF THE INVENTION

1. Field of the invention

The present invention relates to the field of memory accessing, and more particularly to accessing contiguous memory with a limited number of address bits.

2. Prior art

In accessing memory, a variety of prior art techniques are known, wherein address signals from a processor accesses the memory. In some instances, a limited address space is available to access the memory, which memory has a greater capacity than that defined by the address space. That is, for a given size memory, an adequate number of address bits are not available to access the full extent of the memory. One technique of addressing a memory which has greater capacity than that defined by the address space is the use of bank switching. In bank switching, a limited address space is used to address two or more banks of memory, wherein the processor under program control selects an appropriate bank, such as by activating one memory bank while the other bank(s) is kept inactive.

In a second tecnique, an alternate addressing mode is used, wherein signals on data lines are also used to select a portion of the memory. For example, in U.S. Pat. No. 4,685,084 an alternate page mode addressing scheme is described wherein data bits are used to select the appropriate page when in the alternate addressing mode. However, the alternate addressing scheme utilizing page mode, which is taught in U.S. Pat. No. 4,685,084, is typically used for memory space in a single MOS integrated circuit (IC) memory and is used for the purpose of dividing the memory into various pages. However, as memory size increases another level of memory accessing hierarchy is needed. In the event multiple memory arrays are used, or alternatively, multiple memory devices (in the way of multiple memory chips) are utilized, another hierarchical scheme which is one level above the page mode scheme is needed. Further, it would be advantageous to provide the additional memory by having pin compatibility to existing memory devices. For example, it would be advantageous to take a megabit (Mbit) memory device, such as a 1Mbit erasable programmable read-only memory (EPROM), to provide a pin-compatible four 1Mbit EPROM chip set, wherein this 4 Mbit memory space is accessed by the address space of the 1 Mbit scheme.

SUMMARY OF THE INVENTION

An improvement in an integrated circuit memory wherein data bits are used to acess additional stroage capacity. The improvement provides for an alternate chapter addressing mode in which total memory capacity is partitioned into a hierarchical fashion to provide a plurality of chapters wherein each chapter is capable of providing a plurality of pages, if page partitioning is desired.

In the preferred embodiment, a plurality of 1 Mbit EPROMs are arranged in parallel to provide 2,4 and 8 Mbit of total memory capacity. Programmable hard latches are utilized to store a predetermined value at each EPROM device, which value provides a code that is unique to a given EPROM device. The chapter mode data bits are coupled through a pair of soft latches and these bits are compared to the values stored in the hard latches. If the device is in the chapter mode, and the resultant comparison of the data bits to the stored comparison bits results in a match, that device is then activated while the other devices are kept inactive. The data transfer then occurs between the active device and a processing device, such as a microprocessor.

BRIEF DESCRIPTION OF THE DRAWINGS

FIGS. 1A and 1B show a schematic block diagram of the present invention.

FIG. 2 is a circuit schematic diagram of a soft latch of the preferred embodiment.

FIG. 3 is a circuit schematic diagram of a hard latch of the preferred embodiment.

FIG. 4 is a circuit schematic diagram showing of a gating logic circuit and a chapter select logic circuit of the preferred embodiment.

FIGS. 5A and 5B show an electrical block diagram illustrating one application of dividing the total memory into a plurality of chapters and pages.

FIG. 6A shows a 28 pin EPROM package and associated signals to the various pins for different memory sizes.

FIG. 6B shows a 32 pin EPROM package and associated signals to the various pins for different memory sizes.

DETAILED DESCRIPTION OF THE PRESENT INVENTION

An apparatus in which an alternate addressing scheme using chapter mode to access memory having greater storage space than that which is defined by the address space is disclosed. In the following description, numerous specific details are set forth, such as specific circuit components, bit patterns, and pin configurations, etc., in order to provide a thorough understanding of the present invention. It will be obvious, however, to one skilled in the art that the present invention may be practiced without these specific details. In other instances, well-known circuits and signals have not been described in detail in order not to unnecessarily obscure the present invention.

As currently implemented, the present invention is used in an integrated circuit memory device which is fabricated using known metal-oxide-semiconductor (MOS) technology. Further, the memory of the preferred embodiment is an erasable programmable read-only memory (EPROM) and is integrally formed as part of a 1 megabit EPROM memory. However, it is to be appreciated that other memory technology, as well as different size memory devices, can be readily adapted to use the present invention.

Referring to FIGS. 1A and 1B, four equivalent EPROM devices 1-4 are shown. The EPROM devices 1-4 are identical in construction, although the programming of each device will differ. Because each of the EPROMs 1-4 are identical in structure, only the description in reference to EPROM 1 will be described. However, it is to be understood that the description also applies to the other EPROMs 2-4. EPROM device 1 is comprised of an EPROM element 10, which as presently used in the preferred embodiment is a 1 megabit EPROM. EPROM 10 is typically comprised of a plurality of floating gate EPROM memory cells arranged in at least one array and further including additional circuitry such as decoders, buffers, drivers and programming circuits. An address line 8 is coupled to EPROM 10 for accessing locations of EPROM 10. A bidirectional data bus 12 is also coupled to EPROM 10 for the purpose of writing data to EPROM 10 and reading data from EPROM 10. It is to be noted that EPROM 10 and means of accessing and providing data transfer to and from EPROM 10 are well-known in the prior art. Further, buses 8 and 12, as well as control lines to device 1, are coupled to an apparatus which controls the operation of data transfer between that apparatus and device 1. Typically, these controlling devices are processors, microprocessors or microcontrollers.

The actual number of address lines and data lines coupling device 1 to a given processor is a design choice which is usually dictated by the architecture of the processor used. Where ample address lines are available from the processor to address the memory space of EPROM 10, direct addressing of EPROM 10 can be achieved. However, in the instance the address lines cannot access the full extent of the memory space of EPROM 10, alternate addressing schemes must be used to access the full memory capacity of EPROM 10. Typically, limitation to the number of address lines which can access EPROM 10 is the result of the processor not having the capability of generating the additional address signals or, alternatively, pin compatibility of the EPROM device 1 permits only a limited number of address lines to be coupled from the processor.

One alternative addressing scheme is disclosed in U.S. Pat. No. 4,685,084, which is hereby incorporated by reference. U.S. Pat. No. 4,685,084 discloses an alternate page addressing mode, wherein a given memory is partitioned into a plurality of pages. By the use of signals on data lines, different pages within a given memory are selected. The example described in U.S. Pat. No. 4,685,084 illustrates the use of two data bits which are each coupled into a data latch, wherein the values of these two data bits determine which one of four pages will be accessed. The apparatus of U.S. Pat. No. 4,685,084 is incorporated in a page selected logic circuit 11 of device 1. However, in device 1 of the preferred embodiment, three data bits $D_0$, $D_1$, and $D_2$ are coupled as inputs to page select logic 11. The output of page select logic 11 is coupled to EPROM 10 to provide three page mode addressing bits. By using three data bits $D_0$–$D_2$, EPROM 10 can be partitioned to provide a maximum of eight pages. When page select logic 11 is deactivated, page partitioning is not used and EPROM 10 defaults to a single page. Whenever page select logic 11 is activated, the three data bits $D_0$–$D_2$ are latched to provide the three page mode addressing bits which are needed to select one of eight pages of EPROM 10. It is to be appreciated that the number of pages available for partitioning EPROM 10 is a function of the number of bits coupled to page select logic 11 and that number of data bits is a design choice.

The number of pages for partitioning EPROM 10 can be increased by increasing the number of data bits coupled to page select logic 11, yet the page partitioning is limited to the partitioning of EPROM 10 of device 1. If however, additional storage capacity is to be obtained, another hierachical level is desired because in some instances the additional memory storage can only be provided by the use of additional devices.

The present invention provides an alternative addressing mode which is hierarchically a level above that of the page mode addressing scheme. The addressing scheme of the present invention is referred to as a chapter mode, wherein the total combined storage capacity available to a given processor is divided into the chapter scheme of the present invention and wherein each chapter is further partitioned into pages as is described in U.S. Pat. No. 4,685,084. The chapter mode addressing is achieved by arbitrarily designating EPROM 10 of each device 1-4 as a distinct chapter. In order to provide the chapter mode addressing scheme, 2 data bits $D_4$ and $D_5$ are each coupled to a pair of soft latches A and B. Data bit $D_4$ is coupled as an input to soft latch 15, while data bit $D_5$ is coupled as an input to soft latch 16. Each of these soft latches 15 and 16 are used to latch in the data bits $D_4$ and $D_5$, respectively. The outputs of the soft latches are coupled to a gating logic circuit 20. A pair of hard latches 17 and 18 are used to store a value which is programmable. The stored values from hard latches 17 and 18 are coupled as outputs to gating logic 20. A clear signal CLR to each device 1-4 is coupled to the page select logic 11 and soft latches 15 and 16.

Gating logic 20 receives the outputs of latches 15-18 and provides a comparison of the stored values to the values provided as data bits $D_4$ and $D_5$. Gating logic 20 compares the stored state of hard latch A to the value of the data bit coupled through soft latch A. Conversely, gating logic 20 also compares the value of data bit $D_5$ to the value stored in hard latch B. When the hard latch A value matches the soft latch A value, and the hard latch B value matches the soft latch B value, a signal which is called MAT is generated from the gating logic circuit 20 to the chapter select logic 21, which then allows the passage of the logic level of a external (externally generated from the chip) chip enable signal CHE/ (/ is hereinafter used to designate an active low condition) to become the internal (internal to the chip) chip enable signal CE/ to activate EPROM 10. If the hard and soft latches do not match, then the internal signal CE/ is driven high to prevent access of the memory array of that device. Chapter select logic circuit 21 also accepts a chapter enable signal CHAP which signal activates the chapter mode. If chapter mode is not desired, CHAP is low causing chapter select logic circuit 21 to allow a CHE/ to pass through as CE/ to activate EPROM 10. That is, when chapter mode is not desirable, such as a case when only device 1 is present, logic circuit 21 ignores the output of the gating logic circuit 20 and operates as though chapter mode is not active. However, when chapter mode is enabled, then the CE/ will only go low when the proper values are present on data lines $D_4$ and $D_5$ and CHE/ is low. Chapter enable signal CHAP also functions to detect whether the outputs of the hard latches A and B are in their default unprogrammed state. CHAP is high only when the outputs of each latch are complementary pairs.

The use of the chapter mode is better understood when described in reference to all four devices 1-4. When all four devices are used, the same data bits $D_0$–$D_2$ are coupled to the page select logic 11 of each device 1-4, and data bits $D_4$ and $D_5$ are coupled to the respective soft latches A and B of each device 1-4. Assuming that the hard latches for each of the devices are programmed to store the values as illustrated in FIG. 1, then only one EPROM device 1-4 will have an active EPROM if chapter mode is enabled. For example, if bit $D_4$ has a value of 0 and bit $D_5$ has a value of 1, then only gating logic 20 of device 2 will exhibit a match corresponding to the values stored in hard latches A and B to the corresponding values coupled through soft latches A and B. Gating logic 20 of device 2 will then generate an output to chapter select logic 21 of device 2 which then causes a low output of its CE/ signal. For devices 1, 3 and 4; comparison mismatch of the latches A and latches B, will cause gating logic circuit 20 of devices 1, 3 and 4 to cause its respective chapter select logic 21 to generate a high signal as CE/, thereby not activating the EPROM of its respective device. Therefore, by utilizing the chapter mode, one of the four devices 1-4 will be activated, which activation will be dependent on the values of data bits $D_4$ and $D_5$.

Carrying this example one step further, once device 2 has been activated, device 2 has the option of using the page select logic circuit 11. If page mode addressing is not desired, then circuit 11 is not activated and EPROM 10 of device 2 is placed in a default condition, wherein EPROM 10 has one page. However, if circuit 11 is activated, then EPROM 10 is partitioned into eight pages and the selection of a given page is determined by the value of the data bits $D_0$, $D_1$ and $D_2$.

It is to be appreciated that an advantage of using the chapter mode scheme of the present invention is that a number of EPROM devices can be coupled in parallel to provide the additional memory capacity. Further, because multiple devices are used, pin compatibility can be maintained even when additional devices are used. For example, if the initial architecture utilize only device 1, and then later, additional memory capacity is required, EPROM devices 2, 3 and/or 4 can be readily piggybacked upon device 1 to provide the additional memory space without the need to reroute signals to other pins or requiring additional pins.

Referring to FIG. 2, a circuit for the soft latch 15 or 16 as used in the preferred embodiment is shown. Because devices 1-4 of the preferred embodiment utilize complimentary metal-oxide semiconductor (CMOS) technology, a combination of n-channel and p-channel transistors are used. The soft latch circuit is comprised of transistors of 35 and 36 coupled as a transmission gate, and a cross-coupled inverter stage comprised of inverters 37 and 38 followed by a buffer stage 39. The input data bit is coupled to a data buffer stage 30, which then drives the transmission gate transistors 35 and 36. When the data bit is to be latched in, a write enable signal WE goes high to drive the gates of transistors 35 and 36. The WE signal going high causes transistor 35 to conduct and its inversion causes transistor 36 to conduct. The input signal is latched and this latched signal is obtained at the junction of the drains of transistors 35 and 36. This latched-in signal is fed through a cross-coupled inverter stage 37, 38 and an output inverter 39 to provide a latched output signal from soft latch 15 or 16. Clearing of the latch is provided by a clear signal CLR which is coupled to the cross coupled output stage of inverters 37-38 for the purpose of clearing the soft latch. Once latched in, the soft latch retains the signal until the latch is cleared.

Referring to FIG. 3, a hard latch circuit of the preferred embodiment is shown. The hard latch of the preferred embodiment uses EPROM memory cells to provide a programmable storage means for storing the value of the comparison bit. Further, a full latch circuit is used in order to prevent the hard latch from latching up to an improper value. Because a full latch is used, two EPROM cells (shown as left and right EPROM cells) 50 and 51 are used to store the comparison bit value and its complement. The sources of the n-channel floating gate EPROM cell 50 and 51 are coupled to ground. The drain of cell 50 is coupled through an n-channel bias transistor 52 and a p-channel load transistor 53 to a supply voltage such as Vcc, while the drain of cell 51 is coupled through n-channel transistor 54 and a p-channel load transistor 55 to the supply voltage. The gate of transistor 53 is coupled to the drain of transistor 54, while the gate of transistor 55 is coupled to the drain of transistor 52, to provide a cross-coupled configuration wherein the output and its complement are taken from the drains of transistors 52 and 54. In order to program the floating gate cells 50 and 51, the drain of cell 50 is coupled to a programming voltage (Vpp) through an n-channel transistor 56, while the drain of cell 51 is coupled to the programming voltage through an n-channel transistor 57. The gates of transistors 56 and 57 are coupled to an EPROM program control signal, wherein this signal activates transistors 56 and 57 during programming to program one of the cells 50 or 51. Output inverters 58 and 59 are used to drive the value of the comparison bits as an output from the hard latch. It is to be appreciated that although a specific soft and hard latch circuits are shown in FIGS. 2 and 3, a variety of latches can be used to perform the equivalent function as the soft latch and hard latch of the present invention.

Referring to FIG. 4, the gating logic 20 and the channel select logic circuit 21 of the preferred embodiment is shown in schematic form. Gating logic circuit 20 is comprised of two exclusive NOR (XNOR) gates 65 and 66, two NAND gates 67 and 68 and two AND gates 69 and 70. The comparison of the hard latch A and soft latch A is provided by the exclusive ORing function of XNOR gate 65, while the comparison of the hard latch and soft latch B is provided by the XNOR gate 66. The output of the XNOR gates 65 and 66 will be a one logic state only when the comparison of the latched in data bits correspond to the stored comparison bits. The AND function is provided by gate 70. In order to insure that the hard latches are properly programmed with a given value and its complement, the two outputs from hard latch A are coupled as inputs to NAND gate 67 while the two outputs of the hard latch B are coupled as inputs to NAND gate 68. The two outputs of NAND gates 67 and 68 are ANDed through gate 69 to provide the CHAP signal. The output of the two AND gates 69 and 70 are coupled to chapter select logic circuit 21 and acts as the enable signal for the chapter mode.

The chapter select logic circuit 21 is comprised of two pairs of CMOS transistors, wherein each pair is in a parallel feed-through arrangement with two p-channel transistors as a load device for each pair of feed-throughs. The operation of chapter select logic circuit 21 simply provides for the coupling of the external chip enable signal CHE/ to become the internal chip enable signal CE/ line only when the outputs of the two AND gates 69 and 70 are at a one logic state. That is, the CE/ signal will be low to activate its corresponding EPROM 10, only if the hard latches are programmed correctly, the soft latch values match the stored hard latch values, and the CHE/ signal is at a low state. If these conditions are not met, then the CE/ signal will remain high, causing the corresponding EPROM to remain inactive. Again, it is appreciated that a variety of circuits can be utilized to provide the functions of the gating logic circuit 20 and chapter select logic 21.

Referring to FIGS. 5A and 5B, one example application of the present invention is shown. The four devices 1-4 of FIG. 1 is shown wherein each of the 1 Mbit EPROM cell matrix is divided into eight separate pages. Each page is comprised of 131,072 cell matrix. Further, each of the devices 1-4 is packaged in a 28 pin dual in-line package (DIP). The data bus is comprised of eight bit lines $D_0$-$D_7$. Three of the data bits $D_0$-$D_2$ are coupled also to the page select logic circuit, while data bits $D_4$ and $D_5$ are also coupled to the chapter select circuit. Because of the use of the data bits to provide the page select and chapter select functions, only 14 address bits $A_0$-$A_{13}$ are required on the address bus 11. The 14 address lines are coupled to the X and Y decoding circuits of EPROM of the respective device. It is appreciated that 4 Mbits of memory can be accessed by the use of only 14 address lines.

Referring to FIGS. 6A and 6B, an advantage of the present invention in maintaining pin compatibility as memory capacity is increased is shown. In FIG. 6A, a 28 pin dip compatibility is maintained as storage capacity is increased from an initial memory size of 512K to memory sizes of 1M, 2M, 4M and 8Mbits. In FIG. 6B a 32 pin dip having an initial memory size of 1M is increased in storage capacity size to values of 2M, 4M, and 8Mbits. It is to be noted that multiple devices can be used, such as by putting a plurality of devices in parallel, or alternatively, the added memory and associated circuitry can be readily incorporated into a single package.

In FIG. 6A, pins 11 and 12 provide for the page latch at all times, however, pin 13 provides the third page latch bit only when the memory capacity is at 1Mbit or greater. Data bit 5 (pin 17) is used to provide a single address bit when the capacity is at 2M. However, two bits $D_4$ and $D_5$ (pins 16 and 17) are used when 4Mbit is desired. Further, if 8M is desired, then a third chapter latch bit D3 is used such that 3 bits determine which 1M bit chapter out of the total 8M storage capacity will be activated for the given data transfer function.

In FIG. 6B, because 32 pins are used, additional address bits $A_{14}$-$A_{16}$ can be used, wherein these three address bits take the place of the three data bits which provide the paging function.

We claim:

1. In an integrated circuit memory having n address lines accessing more than $2^n$ address locations, an apparatus for providing an alternative addressing mode to access memory locations in excess of that which is capable of being accessed by said n address lines, comprising:

first latching means coupled to receive at least one bit;

program means;

second latching means for storing at least one comparison bit, said second latching means coupled to said program means, said at least one comparison bit accessed from said program means;

comparison means coupled to receive a value of said at least one bit and for generating a comparison of it to a value of said at least one comparison bit and generating an output indicative of said comparison; and select means coupled to receive said output from said comparison means and for generating an enabling signal for enabling said memory if said comparison results in a match.

2. The apparatus of claim 1 wherein said second latching means in comprised of a content addressable memory (CAM) for storing said at least one comparison bit.

3. The apparatus of claim 2 wherein said CAM is comprised of an erasably programmable read-only memory (EPROM).

4. The apparatus of claim 2 further including page select means for partitioning said memory into a plurality of pages, said page select means coupled to receive at least one other bit, said page select means further coupled to said memory.

5. The apparatus of claim 3 further including page select means for partitioning said memory into a plurality of pages, said page select means coupled to receive at least one other bit, said page select means further coupled to said memory.

6. In an integrated circuit memory having n address lines accessing more than $2^n$ address locations, an improvement for providing an alternative addressing mode to access memory locations in excess of that which is capable of being accessed by n address lines, wherein the improvement comprises:

first latching means coupled to receive at least one bit;

program means:

second latching means for storing at least one comparison bit, said second latching means coupled to said program means, said at least one comparison bit accessed from said program means;

comparison means coupled to receive a value of said at least one bit and for generating a comparison of it to a value of said at least one comparison bit and generating an output indicative of said comparison; and select means coupled to receive said output from said comparison means and for generating an enabling signal for enabling said memory if said comparison results in a match.

7. The improvement of claim 6 wherein said second latching means is comprised of a content addressable memory (CAM) for storing said at least one comparison bit.

8. The improvement of claim 7 wherein said CAM is comprised of an erasably programmable read-only memory (EPROM).

9. In an integrated circuit memory having n address lines accessing more than $2^n$ address locations, an apparatus for providing an alternative addressing mode to access memory locations in excess of that which is capable of being accessed by said n address lines, comprising:

a first latch coupled to receive a first bit;

a second latch coupled to receive a second bit;

a first content addressable memory (CAM) latch for storing a first comparison bit;

a second content addressable memory (CAM) latch for storing a second comparison bit;

a comparator coupled to receive said first and second bits and said first and second comparison bits and for generating a comparison of said first bit to said first comparison bit and for generating a comparison of said second bit to said second comparison bit and generating an output indicative of said comparison;

select means coupled to receive said output of said comparator and for generating an enabling signal for enabling said memory if both of said comparisions result in a match.

10. The apparatus of claim 9 further including a page select means for partitioning said memory into a plurality of pages, said page select means coupled to receive at least a third bit, said page select means further coupled to said memory.

11. The apparatus of claim 10 wherein said memory is actually comprised of a plurality of separate integrated circuit devices and wherein said apparatus is for enabling only one said integrated circuit device at a time.

12. The apparatus of claim 11 wherein said CAM latch stores each of said comparison bits in an erasably programmable read-only memory (EPROM).

13. In an integrated circuit memory having n address lines accessing more than $2^n$ address locations, an apparatus for providing an alternative addressing mode to access memory locations in excess of that which is capable of being accessed by said n address lines, comprising:
   first latching means coupled to receive at least one address bit;
   program means;
   second latching means for storing at least one comparison bit, said second latching means coupled to said program means, said at least one comparison bit accessed from said program means;
   comparison means coupled to receive a value of said at least one address bit and for generating a comparison of it to a value of said at least one comparison bit and generating an output indicative of said comparison; and
   select means coupled to receive said output from said comparison means and for generating an enabling signal for enabling said memory if said comparison results in a match.

14. The apparatus of claim 13 wherein said second latching means is comprised of a content addressable memory (CAM) for storing said at least one comparison bit.

15. The apparatus of claim 14 wherein said CAM is comprised of an erasably programmable read-only memory (EPROM).

16. The apparatus of claim 14 further including page select means for partitioning said memory into a plurality of pages, said page select means coupled to receive at least one other address bit, said page select means further coupled to said memory.

17. The apparatus of claim 15 further including page select means for partitioning said memory into a plurality of pages, said page select means coupled to receive at least one other address bit, said page select means further coupled to said memory.

18. In an integrated circuit memory having n address lines accessing more than $2^n$ address locations, an apparatus for providing an alternative addressing mode to access memory locations in excess of that which is capable of being accessed by said n address lines, comprising:
   a data line;
   first latching means for receiving at least one (address bit) accessed via said data line, said first latching means coupled to said data line;
   program means;
   second latching means for storing at least one comparison bit, said second latching means coupled to said program means, said at least one comparison bit accessed from said program means;
   comparison means coupled to receive a value of said at least one address bit accessed via said data line and for generating a comparison of it to a value of said at least one comparison bit and generating an output indicative of said comparison; and
   select means coupled to receive said output from said comparison means and for generating an enabling signal for enabling said memory if said comparison results in a match.

19. The apparatus of claim 18 wherein said second latching means is comprised of a content addressable memory (CAM) for storing said at least one comparison bit.

20. The apparatus of claim 19 wherein said CAM is comprised of an erasably programmable read-only memory (EPROM).

21. The apparatus of claim 19 further including page select means for partitioning said memory into a plurality of pages, said page select means coupled to receive at least one other address bit accessed via said data line, said page select means further coupled to said memory.

22. The apparatus of claim 20 further including page select means for partitioning said memory into a plurality of pages, said page select means coupled to receive at least one other address bit, said page select means further coupled to said memory.

23. In an integrated circuit memory having n address lines accessing more than $2^n$ address locations, an improvement for providing an alternative addressing mode to access memory locations in excess of that which is capable of being accessed by n address lines, wherein the improvement comprises:
   first latching means coupled to receive at least one address bit;
   program means;
   second latching means for storing at least one comparison bit, said second latching means coupled to said program means, said at least one comparison bit accessed from said program means;
   comparison means coupled to receive a value of said at least one address bit and for generating a comparison of it to a value of said at least one comparison bit and generating an output indicative of said comparison; and
   select means coupled to receive said output from said comparison means and for generating an enabling signal for enabling said memory if said comparison results in a match.

24. The improvement of claim 23 wherein said second latching means is comprised of a content addressable memory (CAM) for storing said at least one comparison bit.

25. The improvement of claim 24 wherein said CAM is comprised of an erasably programmable read-only memory (EPROM).

26. In an integrated circuit memory having n address lines accessing more than $2^n$ address locations, an improvement for providing an alternative addressing mode to access memory locations in excess of that which is capable of being accessed by n address lines, wherein the improvement comprises:
   a data line;
   first latching means for receiving at least one address bit accessed via said data line, said first latching means coupled to said data line;
   program means;
   second latching means for storing at least one comparison bit, said second latching means coupled to said program means, said at least one comparison bit accessed from said program means;
   comparison means coupled to receive a value of said at least one address bit accessed via said data line and for generating a comparison of it to a value of said at least one comparison bit and generating an output indicative of said comparison; and select means coupled to receive said output from said comparison means and for generating an enabling signal for enabling said memory if said comparison results in a match.

27. The improvement of claim 26 wherein said second latching means is comprised of a content addressable memory (CAM) for storing said at least one comparison bit.

28. The improvement of claim 27 wherein said CAM is comprised of an erasably programmable read-only memory (EPROM).

29. In an integrated circuit memory having n address lines accessing more than $2^n$ address locations, an apparatus for providing an alternative addressing mode to access memory locations in excess of that which is capable of being accessed by said n address lines, comprising:
- a first latch coupled to receive a first address bit;
- a second latch for receiving a second address bit;
- a first content addressable memory (CAM) latch for storing a first comparison bit;
- a second content addressable memory (CAM) latch for storing a second comparison bit;
- a comparator coupled to receive said first and second address bits and said first and second comparison bits and for generating a comparison of said first address bit to said first comparison bit and for generating a comparison of said second address bit to said second comparison bit and generating an output indicative of said comparison; and
- select means coupled to receive said output of said comparison means and for generating an enabling signal for enabling said memory if said comparison results in a match.

30. The apparatus of claim 29 further including a page select means for partitioning said memory into a plurality of pages, said page select means coupled to receive at least a third address bit, said page select means further coupled to said memory.

31. The apparatus of claim 30 wherein said memory is actually comprised of a plurality of separate integrated circuit devices and wherein said apparatus is for enabling only one said integrated circuit device at a time.

32. The apparatus of claim 31 wherein said CAM latch stores each of said comparison bits in an erasably programmable read-only memory (EPROM).

33. In an integrated circuit memory having n address lines accessing more than $2^n$ address locations, an apparatus for providing an alternative addressing mode to access memory locations in excess of that which is capable of being accessed by said n address lines, comprising:
- a data line;
- a first latch for receiving a first address bit accessed via said data line, said first latch coupled to said data line;
- a second latch for receiving a second address bit accessed via said data line, said second latch coupled to said data line;
- a first content addressable memory (CAM) latch for storing a first comparison bit;
- a second content addressable memory (CAM) latch for storing a second comparison bit;
- a comparator coupled to receive said first and second address bits and said first and second comparison bits and for generating a comparison of said first address bit to said first comparison bit and for generating a comparison of said second address bit to said second comparison bit and generating an output indicative of said comparison; and
- select means coupled to receive said output of said comparison means and for generating an enabling signal for enabling said memory if said comparisons result in a match.

34. The apparatus of claim 33 further including a page select means for partitioning said memory into a plurality of pages, said page select means coupled to receive at least a third address bit accessed via said data line, said page select means further coupled to said memory.

35. The apparatus of claim 34 wherein said memory is actually comprised of a plurality of separate integrated circuit devices and wherein said apparatus is for enabling only one said device at a time.

36. The apparatus of claim 35 wherein said CAM latch stores each of said comparison bits in an erasably programmable read-only memory (EPROM).

* * * * *